United States Patent [19]

Cloke

[11] Patent Number: 4,691,254
[45] Date of Patent: Sep. 1, 1987

[54] DATA PROCESSING SYSTEM INCLUDING ENCODER, DECODER AND WRITE PRECOMPENSATOR, USING RUN LENGTH LIMITED CODE

[75] Inventor: Robert L. Cloke, Santa Clara, Calif.

[73] Assignee: Priam Corporation, San Jose, Calif.

[21] Appl. No.: 748,157

[22] Filed: Jun. 24, 1985

[51] Int. Cl.⁴ .............................................. G11B 5/09
[52] U.S. Cl. ........................................ 360/45; 360/46
[58] Field of Search ............... 360/45, 46, 40, 43, 360/48; 375/18, 19, 34

[56] References Cited

U.S. PATENT DOCUMENTS 4,000,513 12/1976 Precourt ................................. 360/45
4,547,890 10/1985 Gindi ..................................... 360/45

Primary Examiner—Vincent P. Canney
Attorney, Agent, or Firm—Flehr, Hohbach, Test, Albritton & Herbert

[57] ABSTRACT

A data processing system employs a run-length limited code and incorporates an encoder and decoder sharing common circuits, including a data shift register, a code shift register and a write precompensation logic circuit. Data bits are processed as single words or double words depending upon the pattern of data bits as they are shifted.

10 Claims, 6 Drawing Figures

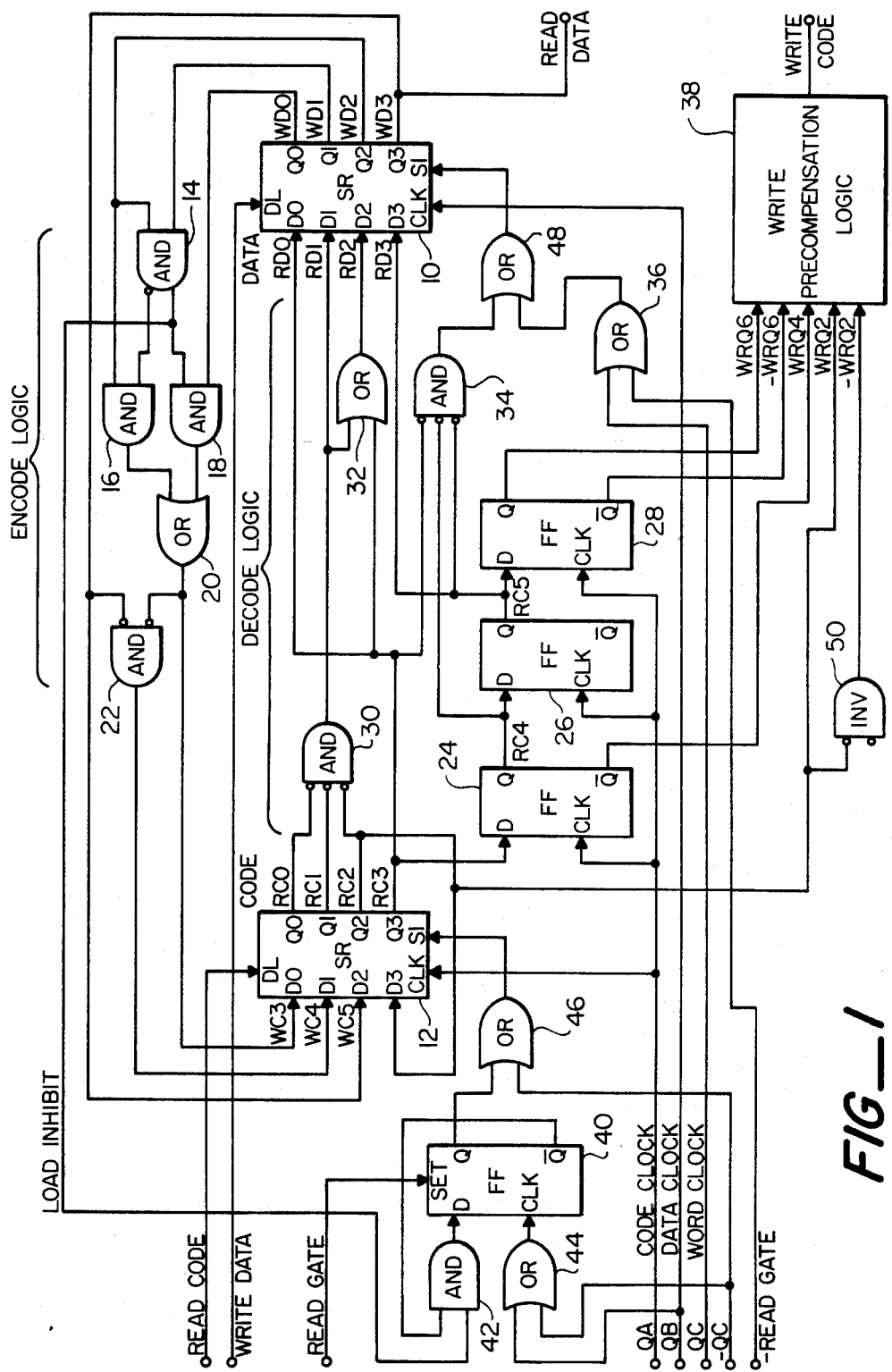
FIG_1

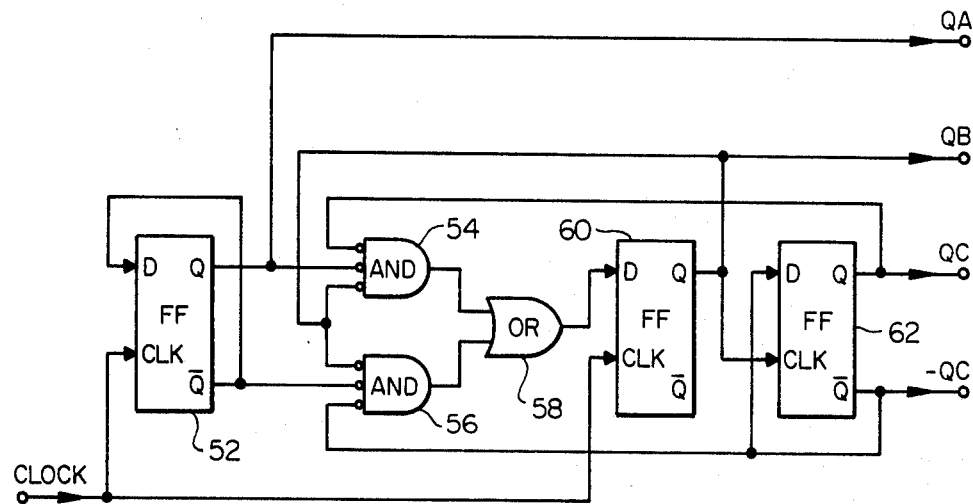
FIG_2
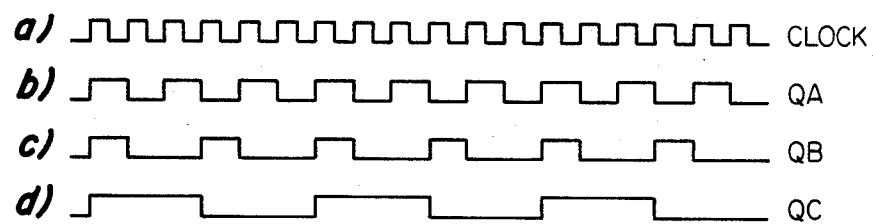
FIG_3

DATA PROCESSING SYSTEM INCLUDING ENCODER, DECODER AND WRITE PRECOMPENSATOR, USING RUN LENGTH LIMITED CODE

DESCRIPTION

1. Technical Field

This invention relates to a data processing system using a run length limited code and incorporating an encoder, decoder and write precompensation circuit.

2. Background Art

In prior art data processing systems, run length limited (RLL) codes have been used for providing high density recording of digital data. In order to attain the desired high density recording when using RLL code, data bits are converted to coded bits during the record mode, so that a controlled number of ZEROs appear between ONEs in the encoded data to be recorded. During readout, the encoded stored data is converted to read data bits. In each case, combinatorial logic circuits are employed to accomplish the conversion. In such systems, the encoder and decoder are generally separate circuits, and if combined, employ excessive circuitry. In addition, in high density data processing systems wherein the data bits are closely packed for recording, write precompensation is required to shift, that is, delay or advance data bits relative to defined timing pulses, so that the bits to be recorded are registered properly within the prescribed time slots or windows.

The present trend is to make disk drives more compact so that a high capacity disk system will fit into a very small space. Therefore it is necessary to reduce the size of the electrical circuitry and the number of components, as well as reducing the size and number of parts, to achieve this objective.

U.S. Pat. No. 4,337,458 is representative of an encoder-decoder circuit which employs an RLL code. However, the patent apparatus does not include a write precompensator, which is generally desirable in order to properly record the data bits within prescribed time slots or windows. Also, in prior art apparatus, separate circuit elements are used for the encoding and decoding of data, resulting in a system that generally requires seven shift registers and two read-only memories. Furthermore, the code tables used for RLL encoding, in accordance with the prior art, are not directly compatible with the standard message format used by the disk drive industry. The standard header information used by the industry is a continuous pattern of zeros. Therefore, prior art apparatus does not synchronize to the standard pattern, and a word is needed to be inserted into the data stream to allow for synchronization of the decoder. In prior art apparatus, a long string of continuous zeros is encoded with a code word which contains a plurality of binary ONES per word. Thus the decoder has no unambiguous way of synchronizing its word boundaries with those of the incoming code, and a special word-synchronization character has to be written in order to obtain synchronization.

SUMMARY OF THE INVENTION

An object of this invention is to provide a data processing system which employs an RLL code, wherein the encoder and decoder share common circuits, thereby effectively reducing the amount of circuitry necessary for these functions.

Another object of this invention is to provide an apparatus and method for employing modified RLL code to afford synchronization of the decoder in a simplified manner.

Another object is to provide in one apparatus the combination of the encoding, decoding and write precompensation functions.

In accordance with this invention, a data processing circuit useful for magnetic recording incorporates an encoder and decoder, which includes two shift registers that are common to the encoder-decoder network for handling data and code. The data processing circuit also includes a prewrite compensation circuit coupled to the shift registers.

In a preferred embodiment, a modified 1,7 RLL code is used that operates at a two-thirds rate. The modified code allows unambiguous decoding of a code stream which represents a continuous string of 00 data words. A modified code table provides a more direct mapping of the data and code words relative to each other, and thus fewer and less complex parts are needed to perform the function.

BRIEF DESCRIPTION OF THE DRAWINGS

The invention will be described in detail with reference to the drawings in which:

FIG. 1 is a schematic and block circuit diagram of the encoder-decoder network including a write precompensator, in accordance with this invention;

FIG. 2 is a schematic and block circuit diagram of a three-stage counter used to provide the clock signals to the circuit of FIG. 1; and FIG. 3 consisting of a through d is a series of waveforms defining the output signals obtained from the circut of FIG. 2.

Similar numerals refer to similar elements throughout the drawing.

DESCRIPTION OF THE PREFERRED EMBODIMENT

With reference to FIG. 1, a data processing system includes a data shift register 10 that receives write data signals serially from a controller, for example, during the write mode or recording of data. The system includes a data shift register 10 and a code shift register 12, encoding logic and decoding logic, and a write precompensation logic circuit 38.

With reference to FIGS. 2 and 3, timing signals for the system are generated by a reference clock (FIG. 3a), which may be obtained from a phase locked oscillator. The reference clock signal is divided by flip-flop 52 to provide a timing pulse QA (FIG. 3b) in response to positive going transitions of the clock signal. The timing pulse QA synchronizes the code shift register 12, and bistable multivibrators or flip-flops 24, 26 and 28 (FIG. 1) to the system. A timing pulse QB (FIG. 3c) for clocking data is produced at two-thirds the rate of code clock QA by means of negative AND logic circuits 54 and 56, each having three inputs, and an OR gate 58 and flip-flop circuit 60. Positive and negative transition of a word clock QC (FIG. 3d) are produced at the output of flip-flop 62 at one-half the frequency of the data rate QB.

When in a set condition, the flip-flop 52 provides an input signal to negative AND gate 56 and provides the code clock signal QA which controls the timing of code shift register 12. In its reset state, the flip-flop 52 provides a signal to negative AND gate 54. AND gate 54 also receives a word clock signal QC generated at the output of flip-flop 62, whereas AND gate 56 receives the inverted word clock signal −QC. The third input to the AND gates 54 and 56 is derived from the flip-flop 60, which generates the data shift register clock QB in response to the reference clock. The flip-flop 60 receives an alternating output from AND gate 56 and 54 through OR gate 58 during the set and reset periods of flip-flop 52.

The shift registers used in the preferred embodiment are industry standard Emitter-Coupled-Logic Universal Shift Registers, type number 10141. These parts are able to perform several operations, but only two operations are required for this system, as follows: (A) If the S1 input is low, load four bits in parallel through the D0–D3 inputs, or (B) If the S1 input is high, shift left, which causes the bit which was in the Nth cell to move to the N+1 cell, and the DL input to be shifted into the Q0 cell. Whichever operation is selected by S1 is initiated with the rising edge of the CLK input.

During write mode operation, the write data is continuously shifted into the data shift register 10 in synchronism with the data clock QB. Shift register 10 is held in the shift mode by a high -Read Gate signal propagated through OR gates 36 and 48 to the control input, S1 of shift register 10. The write data is encoded by means of a logic circuit comprising AND gates 14, 16, and 18, OR gate 20, and negative AND gate 22, as depicted in FIG. 1.

The encode logic circuit effectuates the encoding of the write data and accomplishes the look ahead by sensing the D0 and D1 bits of the data word. The RLL code used in the preferred embodiment of this invention is represented by the following Tables I and II.

TABLE I

| DATA WORD | | | | CODE WORD | | | | | |
|---|---|---|---|---|---|---|---|---|---|
| D3 | D2 | D1 | D0 | C5 | C4 | C3 | C2 | C1 | C0 |
| 0 | 1 | 1 | 0 | 0 | 1 | 0 | 0 | 0 | 0 |
| 0 | 1 | 1 | 1 | 0 | 0 | 1 | 0 | 0 | 0 |
| 1 | 1 | 1 | 0 | 1 | 0 | 0 | 0 | 0 | 0 |
| 1 | 1 | 1 | 1 | 1 | 0 | 1 | 0 | 0 | 0 |

TABLE II

| DATA WORD | | CODE WORD | | |
|---|---|---|---|---|
| D3 | D2 | C5 | C4 | C3 |
| 0 | 0 | 0 | 1 | 0 |
| 0 | 1 | 0 | 0 | 1 |
| 1 | 0 | 1 | 0 | 0 |
| 1 | 1 | 1 | 0 | 1 |

Table I is used whenever a data word D0–D3 is recognized during the write mode or a code double word C0–C5 is sensed during the read mode in the defined sequences. Otherwise, the code of Table II is implemented so that only a single word is encoded or decoded at any given time. This RLL code allows unambiguous decoding of a code stream that represents a continuous string of 00 data words.

In operation, the data shift register 10 stores four data bits D0–D3 which are applied to the encode logic circuit. If the status of the four bits appear in any of the sequences listed in Table I under D0–D3 of the "DATA WORD" column, then the encode logic acts to encode the data in a double word sequence C0–C5 as set forth under "CODE WORD" in Table I.

Both the single word code in Table II and the double word code in Table I are implemented by the encode logic which receives a continuous stream of data bits from the data shift register 10 at write data lines WD0–WD3. AND gate 14 receives data bits WD1 and WD2 that represent write data bits D1 and D2. If binary "ones" are present, the AND gate 14 passes a negative or low signal to AND gate 16 and a positive or high signal to AND gate 18.

The AND gate 16 also receives a signal of polarity relating to data bit D2. If enabled by a high level from AND gate 14, AND gate 16 propagates the level of write data bit WD2 through OR gate 20 to the write code bit WC3. Conversely, AND gate 18 receives a signal relating to the state of WD0 and, when enabled by a high level from AND gate 14, will propagate the state of WD0 through OR gate 20 to WC3. Negative AND gate 22 is fed a signal from OR gate 20 in conjunction with a signal from register stage Q3 corresponding to bit WD3. If two binary zeros are sensed, the negative AND gate 22 will supply a write code bit WC4 equal to "ONE" to the code shift register 12 at stage D1. At the same time, the stetus of the bit at stage Q3 of the data shift register 10 is passed to the D2 stage of code shift register 12 as a write code bit WC5. The OR gate 20 also provides a write code bit WC3 to the D0 stage of the code shift register. The D0, D1 and D2 inputs are parallel loaded into the code shift register 12.

During the encode process, the write data is continually shifted into the shift register 10 by the data clock QB, and encoded in accordance with the code tables which can be represented by the following equations:

$$C5 = D3 \quad (1)$$

$$C4 = -C5 \cdot -C3 \quad (2)$$

$$C3 = D2 \cdot [ -(D1 \cdot D2)] + D0(D1 \cdot D2) \quad (3)$$

$$C2 = C1 = C0 \text{ IF } D1 \cdot D2 = 1, \quad (4)$$

OTHERWISE ENCODE AS SUBSEQUENT WORD

The first three equations are directly implemented in the combinatorial encoding logic, while the last equation (4) is implemented by means of flip-flop 40 which receives the data clock signal QB through OR gate 44, and a load inhibit signal derived from AND gate 14 that is passed through AND gate 42. The load inhibit signal will inhibit loading of the code shift register during the second half of the double word, if two adjacent binary ONES are present at WD1 and WD2. In such a case, the second half of a coded double word equal to three successive binary zeros is shifted in serially. During the write operation, the Read Code line is in its low state, thereby giving the value of zero to these bits to be shifted in. If there are not two adjacent binary ONES at D0 and D1 in the data shift register 10, then the code of Table II is implemented.

Flip-flops 24, 26, and 28 are clocked by code clock QA and extend the length of shift register 12 by three bits, and provide two of these bits to the write precompensation logic circuit 38. In addition the write precompensation logic circuit receives a data bit WR Q2 from the Q2 stage of the shift register 12. Write precompensation is provided by means of the logic circuit 38 which receives write data bits from the flip-flop 24, flip-flop 28 and code register 12. Whenever a data bit is present in flip-flop 24, a write bit −Q4 is sent to the write precompensation circuit 38. During the write mode, the code register 12 provides a coded write bit from stage Q2 to circuit 38. The Q2 bit is also inverted in inverter 50 for application to the logic circuit 38. Simultaneously, flip-flop 24 provides a write data bit $-Q4$ when in its negative state to the circuit 38, and flip-flop 28 provides both positive and negative write data bits Q6 and $-Q6$ to the precompensation logic circuit. The precompensation circuit looks at the states of the Q2, Q4 and Q6 signals derived respectively from the code register 12, the flip-flop 24 and flip-flop 28. The $-Q4$ write data bit is advanced or delayed in accordance with the states of the adjacent Q2 and Q6 bits.

During the read mode, the coded read signals obtained from the storage medium and controller are shifted continuously and serially along the Read Code line into code shift register 12. To cause shift register 12 to continually shift the read code in synchronism with code clock QB, a Read Gate signal is applied to set flip-flop 40. The high level thus produced on the Q output of flip-flop 40 will be propagated through OR gate 46 to the S1 input of shift register 12. The code tables listed supra are employed to decode the coded read signals by the combinatorial logic utilizing the following equations:

$$D3 = C5 \tag{1}$$

$$D2 = C3 + (-C2 \cdot -C1 \cdot -C0) \tag{2}$$

$$D1 = -C2 \cdot -C1 \cdot -C0 \tag{3}$$

$$D0 = C3 \tag{4}$$

The read data is decoded by means of the decode logic circuit comprising negative AND gate 30 (corresponding to equation 3) and OR gate 32 (corresponding to equation 2). The decode logic look-ahead is accomplished by means of AND gate 30 which changes the decode logic between that of Table I or Table II, respectively, in accordance with whether or not three zeros were sensed in locations RC0 through RC2.

An inverted Read Gate signal is applied to OR logic gate 36 which also receives a word clock QC. The output of OR gate 36 is fed through OR gate 48 so that an inhibit load signal S1 is provided to the data shift register 10. A three input negative AND gate 34 receives signals from stage Q3 of shift register 12 and from the flip-flops 24 and 26. The flip-flops 24 and 26 are timed by code clock QA and activated by code register stage output Q3. The output of AND gate 34 is applied to OR gate 48. The output of OR gate 48 is supplied to control the operation of the data shift register 10 at the time of the data clock QB for shifting or loading the decoded read signals received from the code shift register 12 and $-$AND gate 30 and OR gate 32.

The status of the readout data bits Q0–Q3 in code shift register 12 is passed to the output uponapplication of the clock pulse QA. The clock pulse also is applied to flip-flop 24, flip-flop 26 and flip-flop 28 to synchronize the outputs of the read data bits from the flip-flops with the code shift register 12. The three bits Q0, Q1 and Q2 are seen at the output of the code shift register as read code bits RC0, RC1 and RC2, which are applied to the negative AND gate 30 of the decode logic. The read data signal RD1 is applied directly to the data shift register 10 from the AND gate 30 and the data bit RD2 is obtained from the AND gate 30 through the OR gate 32, or from the readout coded bit RC3 derived from the code shift register 12.

The decode logic effectively looks at six readout data bits Q0–Q5. If gate 30 recognizes three successive binary zeros for coded read bits RC0, RC1, RC2, then logic gates 32, 34 and 36 which perform the decoding function determine that the double word of Table I will apply. As in the write mode, during the read (or decode) mode, a load inhibit signal is produced in order to prevent overwriting of the second half of a double-word decode. Negative AND gate 34 produces the load inhibit signal when it senses three zeros in read code locations RC3, RC4, and RC5. The timing of these zeros coincides with when the next load would normally be allowed in the single word case or the first half of a subsequent double word. OR gates 36 and 48 allow control of the shift operation of shift register 10 during write mode, and at times not defined as word boundaries.

By means of the novel circuit disclosed herein, the amount and complexity of circuit components for implementing coding and decoding is effectively reduced. Write precompensation is provided using logic elements which are incorporated into the encoding and decoding channels. The circuit is greatly reduced in size which allows recommendation in small disk drives. It should be understood that the invention is not limited to disk drives or magnetic recording devices, but is applicable to other systems such as digital communication apparatus by way of example.

What is claimed is:

1. A circuit for processing data signals comprising:
   a data shift register for receiving write data bits during a write mode;
   a logic network for encoding said data bits in a run length limited code;
   a code shift register coupled to said encoding logic network for loading and shifting coded write data bits;
   a write precompensation logic circuit coupled to the output of said code shift register for selectively advancing and delaying said coded data bits; and
   a source of timing signals for synchronizing said code shift register and said data shift register so that only valid data bits are passed to said write precompensation logic circuit.

2. A circuit as in claim 1, wherein said data bits are selectively encoded in either a single word of a predetermined number of coded bits and a double word of twice said number of coded bits.

3. A circuit as in claim 2, wherein said code shift register shifts a number of bits defining the first half or the last half of a double word.

4. A circuit as in claim 2, wherein during the write mode, said words are loaded into said code shift register in parallel, and when all the bits of one-half of the coded word are identical, bits of that same value are serially shifted into said code shift register.

5. A circuit as in claim 1, further including a source of coded readout bits; means for applying said coded readout bits to said code shift register; a logic network for decoding said coded bits coupled to said code shift register; means for applying said decoded bits to said data shift register, so that recovered read data bits are passed by said data shift register in response to said timing signals.

6. A circuit as in claim 5, including means for decoding a double word when a defined pattern is sensed, and if a double word is not sensed, a single word is decoded.

7. A circuit as in claim 5, wherein said data shift register and code shift register are employed for both the write mode and read mode in combination with said encoding logic and decoding logic network.

8. A circuit as in claim 1, wherein said logic network includes serially connected flip-flops coupled between said code shift register and said write precompensation logic.

9. A circuit as in claim 1, wherein said write data bits are loaded serially into said data shift registers and said data shift registers store a data word of a given number of bits at a time; including means for sensing the last half of said given number of bits so that said encode logic network selectively encodes said data bits into single words and double words.

10. A circuit as in claim 1, wherein said encoding is implemented so that a double coded word is produced if a defined data sequence is sensed, and whenever a defined data sequence is not recognized, a single coded word is produced.

* * * * *